(12) United States Patent
Lee et al.

(10) Patent No.: US 7,004,236 B2
(45) Date of Patent: Feb. 28, 2006

(54) FAN HOLDER

(75) Inventors: Hsieh Kun Lee, Tu-Chen (TW); Cui-Jun Lu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 35 days.

(21) Appl. No.: 10/769,665

(22) Filed: Jan. 29, 2004

(65) Prior Publication Data
US 2004/0194927 A1 Oct. 7, 2004

(30) Foreign Application Priority Data
Jan. 29, 2003 (TW) .............................. 92201646 U

(51) Int. Cl.
*F28F 7/00* (2006.01)
(52) U.S. Cl. ..................................... 165/80.3; 361/697
(58) Field of Classification Search ............... 165/80.3, 165/121, 76; 361/697
See application file for complete search history.

(56) References Cited

U.S. PATENT DOCUMENTS

| | | | | |
|---|---|---|---|---|
| 5,421,402 A | * | 6/1995 | Lin | 165/80.3 |
| 5,495,392 A | * | 2/1996 | Shen | 361/697 |
| 5,724,228 A | * | 3/1998 | Lee | 361/697 |
| 6,017,185 A | | 1/2000 | Kuo | |
| 6,118,657 A | * | 9/2000 | Clemens | 361/697 |
| 6,160,704 A | * | 12/2000 | Rusate | 361/697 |
| 6,311,766 B1 | * | 11/2001 | Lin et al. | 165/80.3 |
| 6,341,644 B1 | * | 1/2002 | Lo et al. | 165/80.3 |
| 6,343,013 B1 | * | 1/2002 | Chen | 165/80.3 |
| 6,520,250 B1 | * | 2/2003 | Lee et al. | 165/121 |
| 2002/0088607 A1 | * | 7/2002 | Lo | 165/80.3 |

FOREIGN PATENT DOCUMENTS

| | | |
|---|---|---|
| TW | 428745 | 4/2001 |
| TW | 458320 | 10/2001 |

* cited by examiner

*Primary Examiner*—Teresa J. Walberg
(74) *Attorney, Agent, or Firm*—Wei Te Chung

(57) ABSTRACT

A fan holder (10) of the present invention includes a rectangular base (11). The base includes a first surface (12) and a second surface (13) opposite to the first surface and has an opening (14) defined in a center thereof. Two clamping arms (16) extend perpendicularly from opposite side edges of the first surface of the base, the arms having hooks (17) formed inwardly at ends thereof for sandwiching the fan (20) therebetween. Two clamping tabs (18) extend perpendicularly from opposite side edges of the second surface of the base in directions away from the clamping arms. Each clamping tab has a hook (19) formed outwardly at an end thereof. The fan holder is firmly secured to the heat sink (30), with the clamping tabs supported on two protrusions (35) formed at two fins (34) of the heat sink and the hooks of the tabs engaged with the heat sink.

9 Claims, 4 Drawing Sheets

FAN HOLDER

BACKGROUND OF THE INVENTION

1. Field of the Invention

The present invention relates to a holder, and more particularly to a fan holder for conveniently attaching a fan to a heat sink.

2. Description of Prior Art

Computer electronic devices such as central processing units (CPUs) generate a lot of heat during normal operation. This can deteriorate their operational stability and damage associated electronic equipment. Thus the heat must be removed quickly to ensure normal operation. A heat dissipation device is often attached to a top surface of a CPU, to remove heat therefrom.

Referring to FIG. 3, a conventional heat dissipation device 1 comprises a heat sink 2 and a fan 4. The fan 4 is secured on the heat sink 2 by screws 3 engaging with threads defined in fins of the heat sink 2.

Contemporary CPUs generate unprecedented amounts of heat, which has resulted in large height-to-width ratios of fins of modem heat sinks. The fins of such heat sinks are thin. Thus, in assembly, the fins of the heat dissipation device are prone to deform. During normal operation of the heat dissipation device, the screws are therefore liable to disengage from the fins.

Furthermore, during securing of the screws with the fins of the heat sink, fragments are often tom away from the fins. The fragments are deposited in spaces between the fins of the heat sink thereby decreasing the efficiency of heat dissipation of the heat sink.

An improved means of securing a fan to a heat sink, which overcomes the above problems, is desired.

SUMMARY OF THE INVENTION

Accordingly, an object of the present invention is to provide a fan holder which can firmly and readily attach a fan to a heat sink.

In order to achieve the object set out above, a fan holder for attaching a fan to a heat sink in accordance with the present invention comprises a rectangular hollow base, four positioning posts defined in the base, two clamping arms and two clamping tabs. The base comprises a first surface and a second surface opposite to the first surface. The four positioning posts are disposed at respective corners of the base, and are received in corresponding holes of the fan. The clamping arms extend perpendicularly from opposite side edges of the first surface of the base, and sandwich the fan therebetween. The clamping tabs extend perpendicularly from opposite side edges of the second surface of the base. Each tab has a hook formed outwardly at an end thereof. The fan holder is secured to the heat sink, with the tabs thereof supported on two protrusions formed on two fins of the heat sink and the hooks of the tabs engaged with the fins at which the protrusions are formed.

Other objects, advantages and novel features of the present invention will become more apparent from the following detailed description when taken in conjunction with the accompanying drawings, in which:

DETAILED DESCRIPTION OF THE INVENTION

Figure 1:
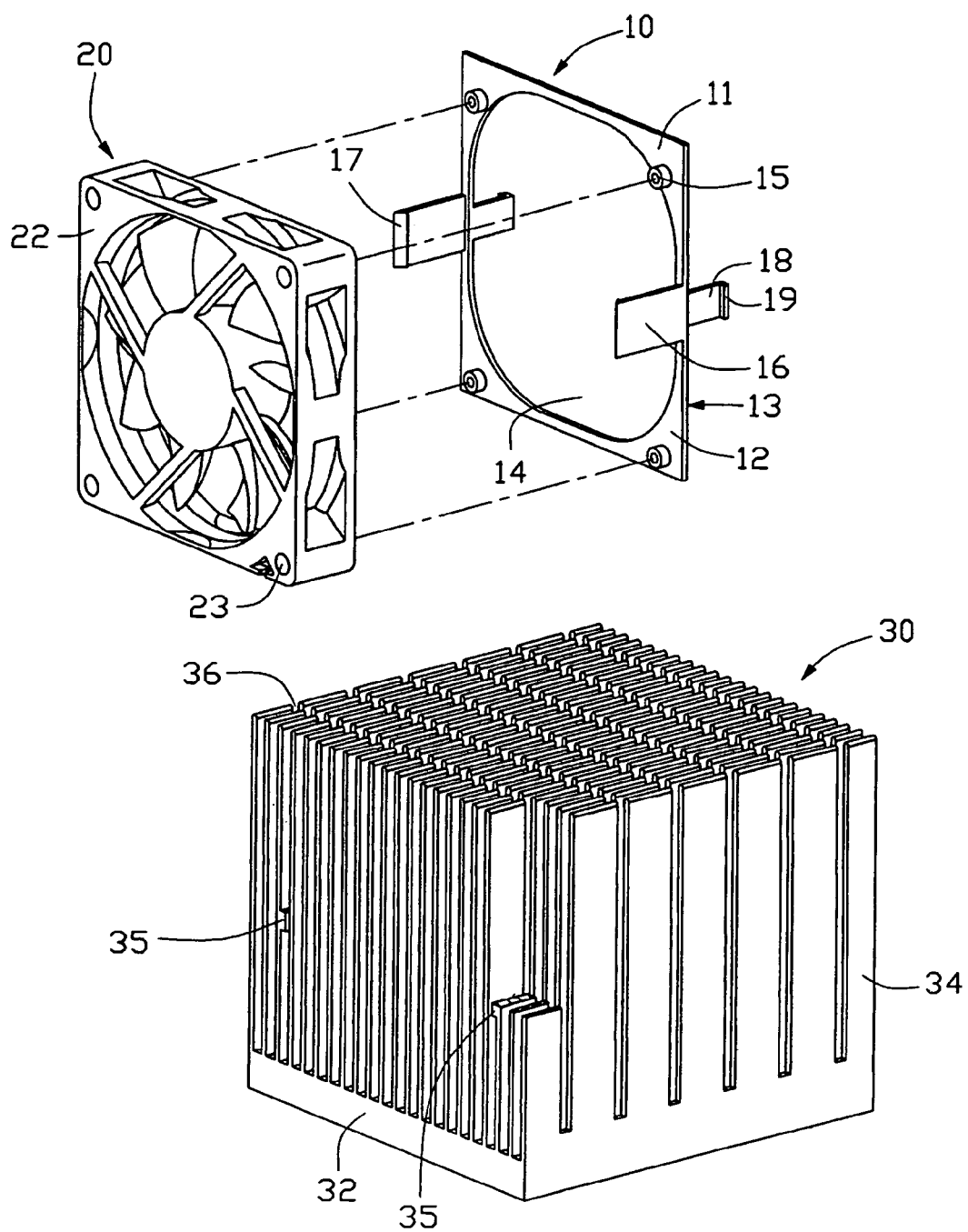
FIG. 1 is an exploded, isometric view of a fan holder in accordance with the preferred embodiment of the present invention, for securing a fan to a heat sink.

Reference will now be made to the drawing figures to describe the present invention in detail. FIG. 1 shows a fan holder 10 in accordance with the preferred embodiment of the present invention, for attaching a fan 20 to a heat sink 30. The fan holder 10 comprises a rectangular base 11. The base 11 has a first surface 12 and a second surface 13 opposite to the first surface 12. An opening 14 is defined in a center of the base 11. Two clamping arms 16 extend perpendicularly from opposite side edges of the first surface 12 of the base 11, each arm 16 being near a center of the respective side edge and having a hook 17 defined inwardly at one end thereof. Four positioning posts 15 are formed on the first surface 12 of the base 11 adjacent to four respective corners of the base 11. Two clamping tabs 18 extend perpendicularly from opposite side edges of the second surface 13 of the base 11 in directions away from the clamping arms 16. Each clamping tab 18 has a hook 19 formed outwardly at an end thereof.

The fan 20 has a rectangular frame 22. Four holes 23 are respectively defined in four corners of the frame 22, corresponding to the positioning posts 15 of the fan holder 10. The heat sink 30 comprises a base 32 defining a longitudinal direction and a lateral direction, and a plurality of spaced parallel fins 34 extending upwardly from the base 32 and parallel to the longitudinal direction. A plurality of grooves 36 is defined perpendicularly through the fins 34 of the heat sink 30 in the lateral direction. Thus the heat sink 30 is divided into a plurality of rows and columns. A pair of protrusions 35 is formed at longitudinal ends of two fins 34 of the heat sink 30.

Figure 2:
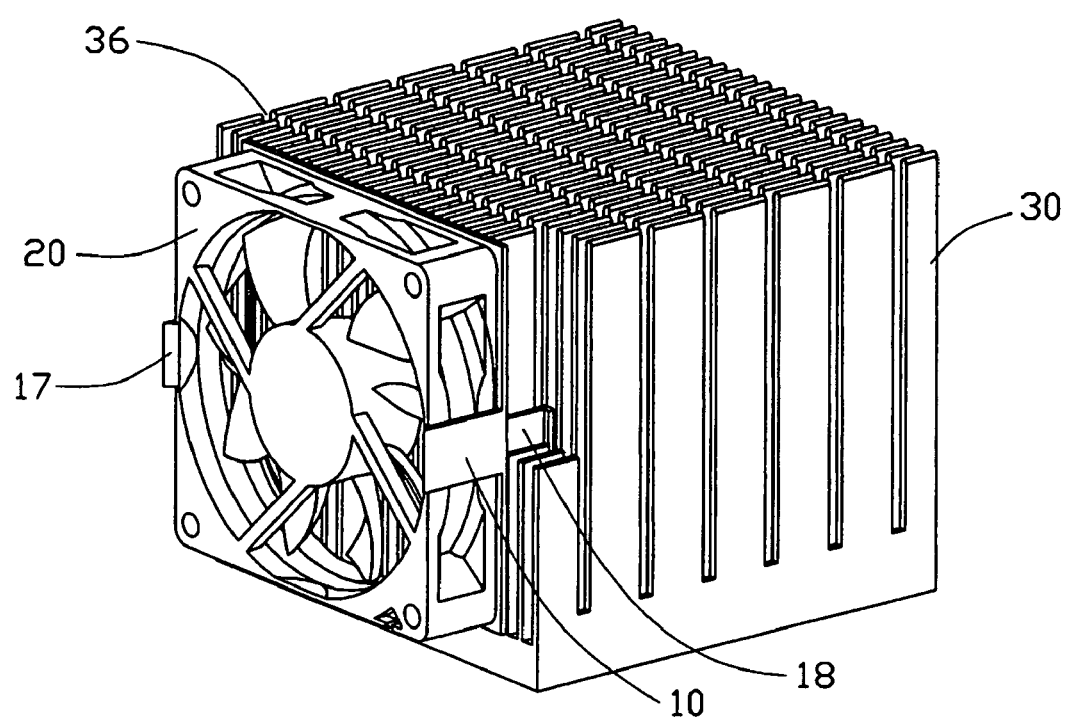
FIG. 2 is an assembled view of FIG. 1.
Figure 3:
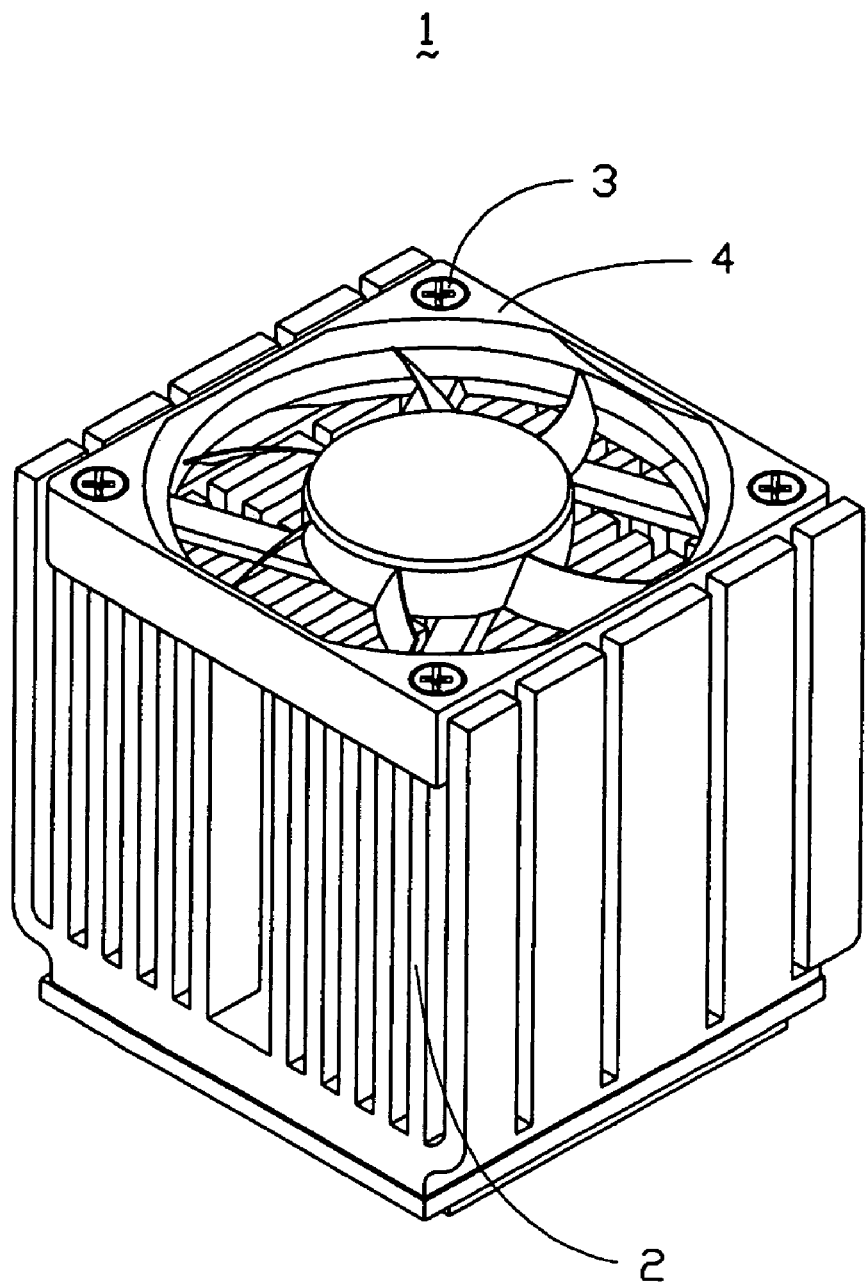
FIG. 3 is an assembled view of a fan attached to a heat sink by a conventional fan holder.

Referring also to FIG. 2, in assembly, the fan 20 is placed adjacent to the fan holder 10, with the holes 23 of the fan 20 receiving the positioning posts 15 of the fan holder 10 therein. The fan 20 is then pressed towards the fan holder 10 until it contacts the first surface 12 of the fan holder 10. The hooks 17 of the clamping arms 16 are snappingly engaged with opposite side edges of the frame 22 of the fan 20, thereby firmly securing the fan 20 on the fan holder 10. The fan holder 10 together with the fan 20 is placed on one side of the heat sink 30, with the clamping tabs 18 of the fan holder 10 located above the two protrusions 35 of the fins 34 of the heat sink 30 respectively. The combined fan holder 10 and fan 20 is pressed downwardly until the tabs 18 contact the protrusions 35 and are supported thereon. The hooks 19 of the tabs 18 are respectively engaged with the fins 34 at which the protrusions 35 are formed. Thus the fan 20 is firmly attached to the heat sink 30 via the fan holder 10.

Figure 4:
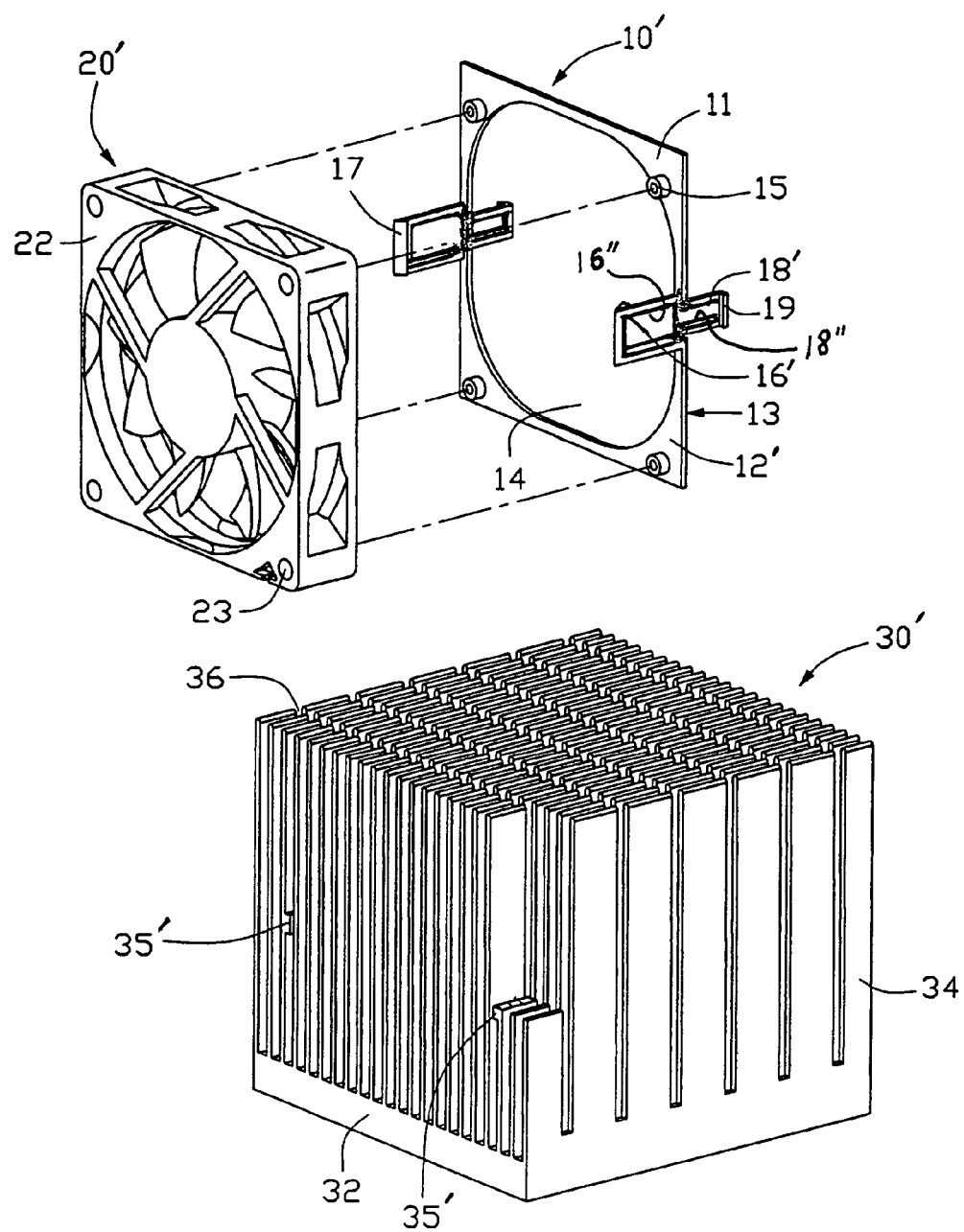
FIG. 4 is another embodiment of the fan holder.

FIG. 4 shows another embodiment of the fan holder 10', the fan 20' and the heat sink 30', under a condition that the fan holder 10' is made from a sheet metal, wherein the tab 18' is stamped from the clamping arm 16' leaving an opening 16" in the clamping arm 16' which extends from an outer edge of the base 12', and bent initially outwardly and successively opposite to the clamping arm 16', and the tab 18' defines an opening 18" for receiving the corresponding protrusion 35' when assembled, thus assuring securement between the fan holder 10' and the heat sink 30'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a heat sink comprising a base defining a longitudinal direction and a lateral direction, and a plurality of parallel fins extending from the base and parallel to the longitudinal direction;
   a fan provided at one end of the heat sink in the longitudinal direction; and
   a fan holder for attaching the fan to the heat sink, the fan holder comprising:
   a rectangular base comprising a first surface and a second surface;
   two clamping arms extending from opposite sides of the first surface of the base and sandwiching the fan therebetween thereby fixing the fan to the holder; and
   two engaging means extending from opposite sides of the second surface of the base and engaging with the heat sink to retain the fan holder to the heat sink in the longitudinal direction and the lateral direction; wherein
   a locating means is formed at one of the fan holder and the heat sink for locating the fan holder to the heat sink along an extending direction of the fins from the base.

2. The heat dissipation device of claim 1, wherein at least one groove is defined perpendicularly through the fins of the heat sink.

3. The heat dissipation device of claim 1, wherein the fan defines four holes and the fan holder forms four positioning posts on four respective corners of the first surface of the base received in the holes for locating the fan to the base.

4. The heat dissipation device of claim 1, wherein each clamping arm defines a hook inwardly formed at an end thereof and snappingly engaged with the fan.

5. The heat dissipation device of claim 1, wherein said two engaging means comprise two clamping tabs, each tab forming a hook at one end thereof engaging with a corresponding fin.

6. The heat dissipation device of claim 5, wherein the locating means comprises two protrusions formed at a pair of the fins and the two clamping tabs are supported on the protrusions respectively.

7. A heat dissipation device comprising:
   a heat sink defining a plurality of fins extending from a base in rows and columns;
   a pair of protrusions formed on two opposite fins in an outermost row;
   a fan holder made from sheet metal and including:
   a planar base defining a large central opening;
   a pair of clamping arms respectively extending from corresponding opposite edges of said base in a first direction;
   a pair of tabs respectively stamped and bent from the corresponding clamping arms in a second direction opposite to the first direction with openings left in the corresponding clamping arm; and
   a fan attached to said fan holder by said pair of clamping arms; wherein
   said pair of tabs respectively engage the corresponding fins for attaching the fan holder to the heat sink.

8. The device of claim 7, wherein each of said tabs further defines an opening latchably receiving the corresponding protrusion therein.

9. The device of claim 7, wherein said opposite edges are outer edges of the base.

* * * * *